United States Patent
Enomoto (12)

(10) Patent No.: US 6,320,140 B1
(45) Date of Patent: Nov. 20, 2001

(54) ONE-SIDED CIRCUIT BOARD FOR MULTI-LAYER PRINTED WIRING BOARD, MULTI-LAYER PRINTED WIRING BOARD, AND METHOD OF ITS PRODUCTION

(75) Inventor: Ryo Enomoto, Gifu (JP)

(73) Assignee: Ibiden Co., Ltd., Gifu (JP)

( * ) Notice: Subject to any disclaimer, the term of this patent is extended or adjusted under 35 U.S.C. 154(b) by 0 days.

(21) Appl. No.: 09/147,372

(22) PCT Filed: Jun. 14, 1996

(86) PCT No.: PCT/JP96/01642

§ 371 Date: Dec. 10, 1998

§ 102(e) Date: Dec. 10, 1998

(87) PCT Pub. No.: WO97/48260

PCT Pub. Date: Dec. 18, 1997

(51) Int. Cl.⁷ .................................................. H01R 23/68
(52) U.S. Cl. ........................ 174/264; 174/262; 174/255; 29/829; 301/795
(58) Field of Search ........................... 174/255, 264, 174/265, 262; 361/748, 790, 792, 795; 29/829, 846, 852; 428/209, 901

(56) References Cited

U.S. PATENT DOCUMENTS

| 4,299,873 | * 11/1981 | Ogihara et al. .................. 428/901 X |
| 4,712,161 | 12/1987 | Pryor et al. .......................... 361/779 |
| 5,374,469 | * 12/1994 | Hino et al. ........................... 428/209 |
| 5,652,042 | * 7/1997 | Kawakita et al. ................... 428/209 |

FOREIGN PATENT DOCUMENTS

| 61225048 | 10/1986 | (JP) . |
| 6-125175 | 5/1994 | (JP) . |
| 6-302956 | 10/1994 | (JP) . |
| 6-326438 | * 11/1994 | (JP) . |

OTHER PUBLICATIONS

An English Language abstract of JP 6–326438.*
English Language Abstract of JP–6–125175.
English Language Abstract of JP–6–302956.
The 9th National Convention Record JIPC (Mar. 5, 1995), ISSN 0916–0043, Tokyo, Japan, pp. 57–59 with partial translation.

* cited by examiner

*Primary Examiner*—Albert W. Paladini
(74) *Attorney, Agent, or Firm*—Greenblum & Bernstein, P.L.C.

(57) ABSTRACT

A single-sided circuit substrate for a multilayer printed writing board has an insulating hard substrate, a conductor circuit formed on a surface of the substrate, an adhesive layer formed on the other surface, and at least one viahole through the substrate and the adhesive layer so as to pass these layers and contact with the conductor. The viaholes are filled with conductive paste. The invention also provides a multilayer printed wiring board having an IVH structure constituted with single-sided circuit hard substrates and a method of efficiently manufacturing the same with high yield.

14 Claims, 4 Drawing Sheets

ONE-SIDED CIRCUIT BOARD FOR MULTI-LAYER PRINTED WIRING BOARD, MULTI-LAYER PRINTED WIRING BOARD, AND METHOD OF ITS PRODUCTION

BACKGROUND OF THE INVENTION

1. Field of the Invention

This invention relates to a single-sided circuit substrate for a multilayer printed wiring board, a multilayer printed wiring board and a method of manufacturing the same, and more particularly, it proposes a single-sided circuit board to be developed for manufacturing a multilayer printed wiring board having an interstitial-viahole structure in higher yield and efficiency, and a multilayer printed wiring board produced by laminating a plurality of such single-sided circuit boards, and a method of manufacturing the same.

2. Description of Background Information

The conventional multilayer printed wiring board is a multilayered body constituted by alternately building up copper-clad laminates and prepregs. This multilayered body has a surface wiring pattern on an outer surface thereof, and has an innerlayer wiring pattern between its interlaminar layers. These wiring patterns are electrically connected via through-holes formed in the multilayered body in a thickness direction thereof between the mutual innerlayer wiring patterns, or between the innerlayer wiring pattern and the surface wiring pattern.

However, in the multilayer printed wiring board having the above-mentioned through-hole structure, it is required to ensure a region for the formation of the through-holes, so that it is difficult to attain a high densification of mounting parts and hence there are disadvantages that it is not able to fully meet the requirements of super-miniaturization of portable electric equipments and practical application of the narrow-pitched packages and MCM (Multi Chip Module).

Recently, instead of the multilayer printed wiring board with the through-hole structure as mentioned above, a multilayer printed wiring board having an interstitial-viahole (IVH) structure has been noticed, which is suitable for the miniaturization and high densification of the electric equipment.

The multilayer printed wiring board having the IVH structure is a printed wiring board having such a structure that conductive viaholes connecting conductor layers to each other are arranged in each of the interlaminar insulating layers forming the multilayered body. That is, in such wiring board, electrical connection between the mutual innerlayer wiring patterns or between the innerlayer wiring pattern and the surface wiring pattern is made through viaholes (buried viaholes or blind viaholes) not passing the wiring substrate. Therefore, in the multilayer printed wiring board having the IVH structure, it is not required to provide specific region for the formation of the through-holes, and hence the miniaturization and high densification of the electric equipment can easily be attained.

As to the multilayer printed wiring board having the IVH structure, there is reported a proposal for the development of the multilayer printed wiring board having the IVH structure for all layers, for instance, on page 57 of "The 9th National Convention Record JIPC (Mar. 2, 1995)" or a draft collection for 9th Circuit Packaging Academic Lecture. The multilayer printed wiring board according to this proposal is developed on the basis of ① high-speed drilling technique of minute viaholes by carbon dioxide gas laser, ② adoption of a composite material of aramide nonwoven fabric and epoxy resin as a substrate material, and ③ interlaminar connecting technique by filling of a conductive paste, and manufactured by the following processes.

At first, an aramide nonwoven fabric impregnated with epoxy resin is used as a prepreg and hole drilling through carbon dioxide gas laser is applied to the prepreg, and then a conductive paste is filled in the resulting hole portions (see FIG. 1(a)).

Next, copper foils are put on both surfaces of of the prepreg, and pressed under heating through heat press. Thus, the epoxy resin in the prepreg and the conductive paste are hardened to provide an electrical connection between the copper foils put on both surfaces of the prepreg (see FIG. 1(b)).

And then, patterning is carried out onto the copper foils by an etching process to provide double-sided hard substrate having viaholes (see FIG. 1(c)).

The formation of multilayers is carried out by using the double-sided substrate as a core layer. Concretely, the prepreg filled with the above conductive paste and the copper foil are successively laminated on both surfaces of the core layer while positioning and again heat-pressed and then the copper foil of the outermost layer is etched to provide a four-layer substrate (see FIGS. 1(d), (e)). If it is intended to further conduct the formation of the multilayer, the above steps are repeated to obtain a six or eight-layer substrate.

The drawback of the above conventional technique is that the production steps become complicated and a long time is taken for the production because the heating and pressing through hot press and the patterning step of the copper foil through etching should be repeated at any number of times.

In the multilayer printed wiring board having the IVH structure obtained by the above production method, it is difficult to confirm the poor patterning of the copper foil in the production course, so that if the poor patterning is caused even at one place (one step) in the production course, the whole of the wiring board as a final product becomes inferior.

That is, the above conventional production process has a fatal drawback that the degradation of production efficiency or production yield is liable to be caused because if inferior good is produced even at one place among the lamination steps, good products made in the other lamination steps should be removed.

It is an object of the invention to provide a single-sided circuit substrate for multilayer printed wiring board developed for efficiently manufacturing a multilayer printed wiring board having an IVH structure in a high yield.

It is another object of the invention to provide a multilayer printed wiring board having an IVH structure constituted with the above single-sided circuit substrates.

It is the other object of the invention to propose a method of efficiently manufacturing the multilayer printed wiring board having the IVH structure in a higher yield by using the single-sided circuit substrates.

SUMMARY OF THE INVENTION

The inventors have made various studies for achieving the above objects, and as a result the invention having the following features and construction has been accomplished.

(1) As a single-sided circuit substrate for a multilayer printed wiring board used for efficiently manufacturing a multilayer printed wiring board having an IVH structure in a high yield, the invention provides a single-sided circuit board for a multilayer printed wiring board comprising an insulating hard substrate, a conductor circuit formed on a surface of the substrate and an adhesive layer formed respectively on the other surface of the substrate, in which holes contacting with the conductor are formed in the substrate and the adhesive layer and a conductive paste is filled therein to form viaholes.

Here, the conductor circuit is desirable to be formed by etching a copper foil of a single-sided copper-clad laminate.

(2) As a multilayer printed wiring board having an IVH structure comprised of the single-sided circuit board described of the above item (1), the invention provides a multilayer printed wiring board having a structure that laminated circuit substrates are electrically connected to each other through interstitial viaholes, characterized in that at least one layer of the circuit substrates is a single-sided circuit substrate comprising an insulating hard substrate, a conductor circuit formed on a surface of the substrate and an adhesive layer formed respectively on the other surface of the substrate, in which holes contacting with the conductor are formed in the substrate and the adhesive layer and a conductive paste is filled therein to form viaholes.

Here, the conductor circuit is desirable to be formed by etching a copper foil of a single-sided copper-clad laminate.

(3) As a method of efficiently manufacturing a multilayer printed wiring board having an IVH structure in a high yield by using the single-sided circuit board of the item (1), the invention provides a method of manufacturing a multilayer printed wiring board comprising the steps of:

① a step of forming a conductor circuit by etching a metal foil adhered to a surface of an insulating hard substrate;

② a step of forming an adhesive layer on a surface opposite to the conductor circuit formed on the surface of the substrate;

③ a step of forming holes contacting with a conductor in the insulating hard substrate and the adhesive layer and filling a conductive paste in the holes to provide a single-sided circuit board; and ④ a step of piling two or more of the single-sided circuit substrates one upon the other or piling the single-sided circuit substrate upon another circuit substrate and then pressing them at once through the adhesive layer provided on the substrate in a multilayer form.

Here, it is preferable to form the holes passing through the insulating hard substrate and the adhesive layer and contacting with the conductor by irradiation of a laser.

And also, the conductor circuit is desirable to be formed etching a copper foil of a single-sided copper clad laminate formed by the adhesion of the copper foil to one surface of the insulating hard substrate.

Figure 1A:
FIGS. 1(a)–1(e) are diagrammatically sectional views illustrating manufacture steps of a multilayer printed wiring board according to the conventional technique.
Figure 1B:
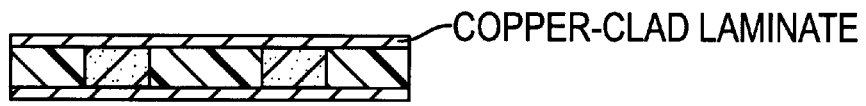
Figure 1C:
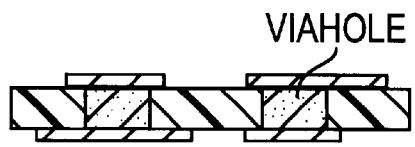
Figure 1D:
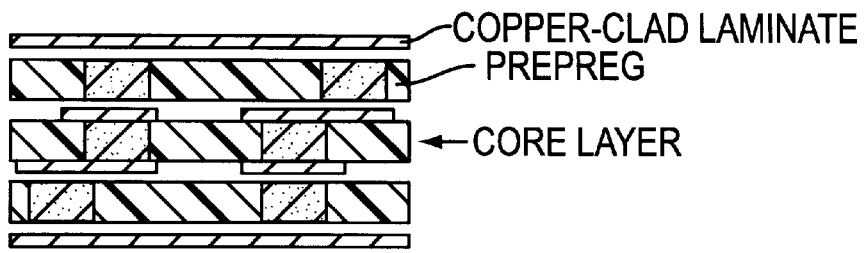
Figure 1E:

In the figures, numeral 1 is a multilayer printed wiring board; 2a, 2b, 2c, 2d insulating hard substrates; 3a, 3b, 3c, 3d conductor circuits; 4a, 4b, 4c, 4d adhesive layers; 5 a conductive paste; 6a, 6b, 6c viaholes; 7a, 7b, 7c, 7d single-sided circuit substrates; 8 a chip component; 9 a solder; 12a, 12b, 12c, 12d insulating hard substrates; 13 a metal foil; 13a, 13b, 13c, 13d conductor circuits; 14a, 14b, 14c, 14d adhesive layers; 16 a hole; 17a, 17b, 17c, 17d single-sided circuit substrates; 18 a conductor circuit at the bottom of the hole; 21 another embodiment of the multilayer printed wiring board; 22 the other embodiment of the insulating hard substrate; 23 the other embodiment of the conductor circuit; 24 the other embodiment of the adhesive layer; 25 the other embodiment of the through-hole; and 26 another embodiment of the viahole.

DETAILED DESCRIPTION OF PREFERRED EMBODIMENTS OF THE INVENTION

The single-sided circuit substrate for the multilayer printed wiring board according to the invention comprises an insulating hard substrate, a conductor circuit formed on a surface of the substrate and an adhesive layer formed respectively on the other surface of the substrate, in which holes contacting with the conductor are formed in the substrate and the adhesive layer and a conductive paste is filled therein to form viaholes.

The adhesive layer constituting the single-sided circuit substrate for the multilayer printed wiring board plays a role of adhering the above single-sided circuit substrates to each other or the above single-sided circuit substrate to another circuit substrate in the manufacture of the multilayer printed wiring board having an IVH structure.

The viahole constituting the single-sided circuit substrate for the multilayer printed wiring board plays a role of electrically connecting the conductor circuit of the above single-sided circuit substrate to a conductor circuit of another circuit substrate to be laminated in the manufacture of the multilayer printed circuit board having the IVH structure. Particularly, the conductive paste filled in the holes passing the insulating hard substrate and the adhesive layer and contacting with the conductor circuit adheres to the conductor circuit of the other adjoining circuit substrate to be laminated by thermosetting and electrically connects to the respective conductor circuit.

The conductor circuits constituting the single-sided circuit substrate for the multilayer printing wiring board are a surface wiring pattern or an innerlayer wiring pattern constituting the multilayer printed wiring board having the IVH structure. Such conductor circuits are formed by etching the metal foil adhered to one surface of the insulating hard substrate, and preferably formed by etching a copper foil of a single-sided copper-clad laminate obtained by laminating the copper foil onto the one surface of the insulating hard substrate.

The multilayer printed wiring board having the IVH structure can efficiently be manufactured in a higher yield by utilizing the single-sided circuit board having the structure as mentioned above.

The method of manufacturing the multilayer printed wiring board by using the above single-sided circuit substrate according to the invention will be described below. That is, the method of the invention is characterized by the following steps:

① a step of forming a conductor circuit by etching a metal foil adhered to a surface of an insulating hard substrate;

② a step of forming an adhesive layer on a surface opposite to the conductor circuit formed on the surface of the substrate;

③ a step of forming holes contacting with a conductor in the insulating hard substrate and the adhesive layer and filling a conductive paste in the holes to provide a single-sided circuit board; and ④ a step of piling two or more of the single-sided circuit substrates one upon the other or piling the single-sided circuit substrate upon another circuit substrate and then pressing them at once through the adhesive layer provided on the substrate in a multilayer form.

Thus, the method of manufacturing the multilayer printed wiring board according to the invention lies in a feature that the single-sided circuit substrates having the conductor circuits forming a given wiring pattern are previously manufactured individually. Therefore, the presence or absence of inferior place of the conductor circuits can be confirmed in these single-sided circuit substrates before the lamination, so that only the single-sided circuit substrates having no inferior place can be used at the lamination stage. As a result, according to the method of the invention, the occurrence of inferior product decreases at the manufacture stage and hence the multilayer printed wiring board having the IVH structure can be manufactured in a higher yield.

Further, according to the method of manufacturing the multilayer printed wiring board according to the invention, it is not required to repeat the step of laminating prepregs and pressing them under heating as in the conventional technique and the single-sided circuit substrate can be piled on another circuit substrate and integrally united with each other through hot pressing at once by utilizing the adhesive layer formed on the single-sided circuit substrate. That is, according to the method of the invention, the multilayer printed wiring board having the IVH structure can efficiently be manufactured in a short time without repeating the complicated steps.

In the above method of the invention, it is desirable to form the holes passing the insulating hard substrate and the adhesive layer and contacting with the conductors by irradiation of a laser. Because, as the hole for the formation of the viahole in the single-sided circuit substrate, it is advantageous to form holes having a fine size at a high density as far as possible, and the application of laser as a hole drilling technique can easily form the holes having a fine size at the high density.

Further, holes passing only the insulating hard substrate and the adhesive layer can be formed by the drilling technique through the laser without damaging the conductor circuit. As a result, the holes are formed at a state of closing one end with the conductor circuit are formed without the formation of the holes passing the prepreg substrate as in the conventional technique, so that the conductive paste is filled in the resulting holes to form a face contact between the viahole and the conductor circuit, whereby a sure connection is obtained.

Thus the manufactured multilayer printed wiring board having the IVH structure according to the invention is characterized in that at least one layer of the circuit substrates constituting the wiring board is a single-sided circuit substrate comprising an insulating hard substrate, a conductor circuit formed on a surface of the substrate and an adhesive layer formed respectively on the other surface of the substrate, in which holes contacting with the conductor are formed in the substrate and the adhesive layer and a conductive paste is filled therein to form viaholes.

Here, the single-sided circuit substrate constituting the multilayer printed wiring board according to the invention is adhered to another circuit substrate through the adhesive layer. As such another circuit substrate, use may be made of the single-sided circuit substrate according to the invention and the conventionally known printed wiring substrate.

Moreover, the multilayer printed wiring board according to the invention may be subjected to various treatments usually made in the printed wiring board such as formation of solder resist on the surface, nickel/gold plating or soldering to the surface wiring pattern, hole drilling, cavity treatment, plating of through-hole and the like.

Furthermore, the multilayer printed wiring board according to the invention is used for mounting an electronic component such as IC package, bare chip, chip component or the like.

EXAMPLE

Figure 2:
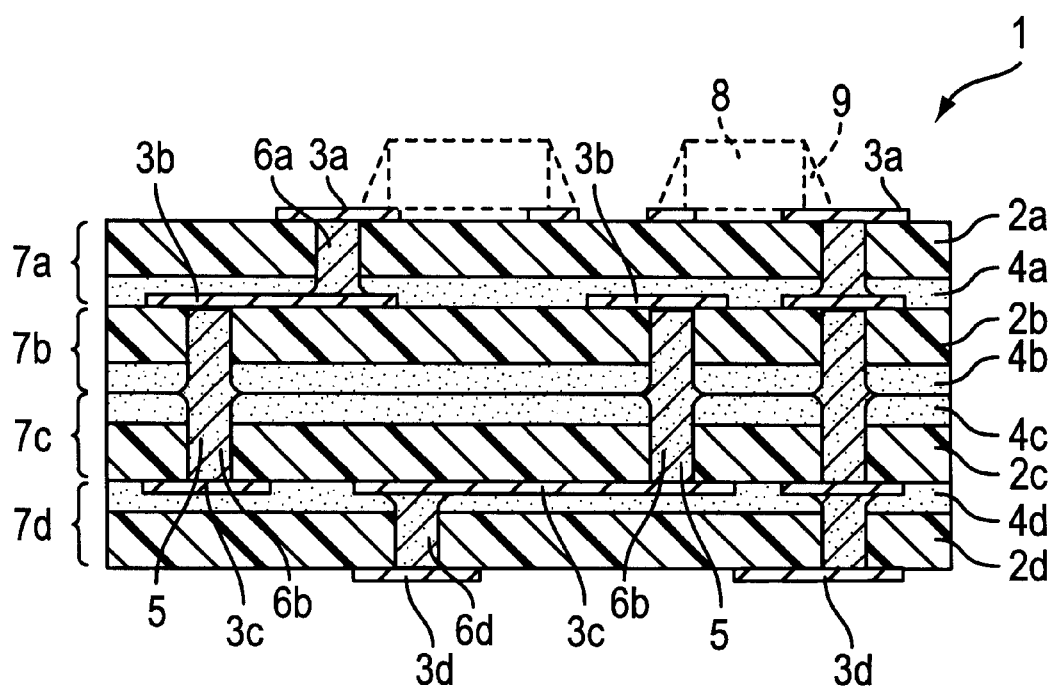
FIG. 2 is a diagrammatically section view of an embodiment of the multilayer printed wiring board according to the invention.

FIG. 2 is a diagrammatically section view of an embodiment of the multilayer printed wiring board according to the invention. In this figure, the multilayer printed wiring board 1 is a four layer board formed by laminating single-sided circuit substrates 7a, 7b, 7c, 7d, which consist of insulating hard substrates 2a, 2b, 2c, 2d and conductor circuits 3a, 3b, 3c, 3d formed by etching a metal foil adhered to a surface of the substrate, adhesive layers 4a, 4b, 4c, 4d each formed on a surface of the substrate opposite to the conductor circuit and viaholes 6a, 6b, 6d formed by filling a conductive paste 5 in holes passing the insulating hard substrates 2a, 2b, 2c, 2d and the adhesive layers 4a, 4b, 4c, 4d and contacting with the conductor circuits 3a, 3b, 3c, 3d, and mutually joining them through the adhesive layers 4a, 4b, 4c, 4d formed on the single-sided circuit substrates 7a, 7b, 7c, 7d, respectively.

In this case, the conductor circuit 3a of the single-sided circuit substrate 7a and the conductor circuit 3d of the single-sided circuit substrate 7d are formed into a given wiring pattern, respectively, and arranged on upper surface and lower surface of the multilayer printed wiring board 1 as a surface wiring pattern. And also, the conductor circuit 3b of the single-sided circuit substrate 7b and the conductor circuit 3c of the single-sided circuit substrate 7c are formed into a given wiring pattern, respectively, and arranged on a lower side of the single-sided circuit substrate 7a and on an upper side of the single-sided circuit substrate 7d in the multilayer printed wiring board 1 as an innerlayer wiring pattern.

Moreover, it is favorable that the conductor circuits 3a, 3b, 3c, 3d are formed by etching a copper foil of a single-sided copper clad laminate provided by forming the copper foil on, for example, a surface of the insulating hard substrates 2a, 2b, 2c, 2d.

And also, the viahole 6a is formed by passing through the insulating hard substrate 2a and the adhesive layer 4a in a thickness direction, and the viahole 6b is formed by passing through the insulating hard substrates 2b, 2c and the adhesive layers 4b, 4c in a thickness direction, and the viahole 6d is formed by passing through the insulating hard substrate 2d and the adhesive layer 4d in a thickness direction, and the conductive paste 5 is filled in each of these viaholes. Among these viaholes, the viahole 6a is a blind viahole electrically connecting the conductor circuit 3a as the surface wiring pattern to the conductor circuit 3b as the innerlayer wiring pattern, and the viahole 6b is a buried viahole electrically connecting the conductor circuits 3b, 3c to each other as the innerlayer wiring pattern, and the viahole 6d is a blind viahole electrically connecting the conductor circuit 3c as the innerlayer wiring pattern to the conductor circuit 3d as a surface wiring pattern. They are interstitial viaholes.

As the insulating hard substrate 2a, 2b, 2c, 2d, use may be made of a substrate formed by curing, for example, glass cloth epoxy resin, glass nonwoven cloth epoxy resin, glass cloth bismaleimide triazine resin, aramide nonwoven cloth epoxy resin or the like in form of a plate.

The adhesive layer 4a, 4b, 4c, 4d may be constituted with a resin adhesive such as epoxy resin, polyimide, bismaleimide triazine, acrylic resin, phenolic resin or the like.

As the conductive paste, use may be made of conductive paste of, for example, copper, silver, gold, carbon or the like.

Various electronic components may be mounted onto the multilayer printed wiring board according to the invention. For example, as shown by a phantom line in FIG. 2, a chip component such as IC package, bare chip or the like may be placed on a given position of the surface wiring pattern 3a and fixed thereto with a solder 9.

The method of manufacturing the multilayer printed wiring board according to the invention shown in FIG. 2 will be described below.

(1) At first, a single-sided circuit substrate 7a (17a) according to the invention constituting the multilayer printed wiring board 1 of FIG. 2 is prepared. It will concretely be described with reference to FIG. 3.

Figure 3A:
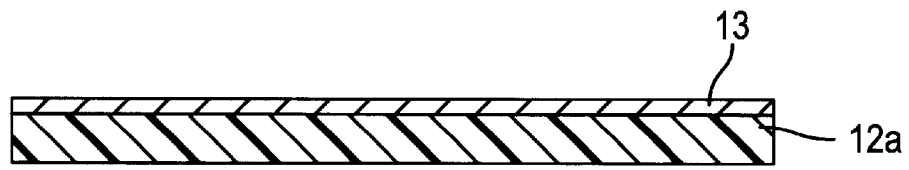
FIG. 3 is a diagrammatically section view illustrating manufacture steps of a single-sided circuit substrate used for the manufacture of the above multilayer printed wiring board.

① There is provided an insulating hard substrate 12a adhered on a surface with a metal foil 13 as shown in FIG. 3(a). For instance, it is advantageous to use a one-sided copper-clad laminate as the insulating hard substrate 12a provided on the surface with the metal foil 13.

Figure 3B:
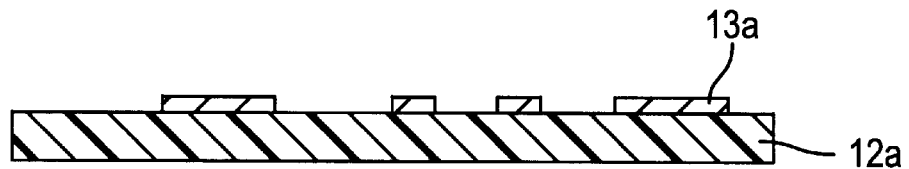

② Next, the metal foil 13 is etched into a given pattern as shown in FIG. 3(b), whereby conductor circuits 13a are formed. Moreover, the well-known usual means can be adopted as the etching method. The conductor circuits 13a are arranged as a surface wiring pattern. If the conductor circuits are arranged as an innerlayer wiring pattern, in order to improve the adhesion property between the layers, the surface of the conductor circuit is advanatgeous to be roughened by using a well-known means such as micro-etching, roughening plating, application of both-surface roughened copper foil or the like.

Figure 3C:
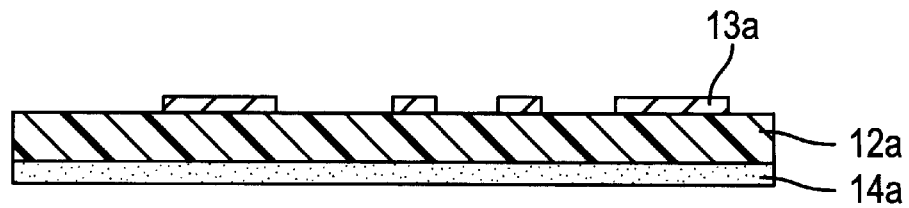

③ Then, an adhesive layer 14a is formed on a surface of the insulating hard substrate 12a having the conductor circuits 13a opposite to the conductor circuit as shown in FIG. 3(c). The adhesive layer 14a may be formed by applying a given resin adhesive by means of a roll coater, curtain coater, spray coater, screen printing or the like and then precuring, or by laminating an adhesive sheet. In this case, the thickness of the adhesive layer is advantageously within a range of 10~50 μm.

Figure 3D:
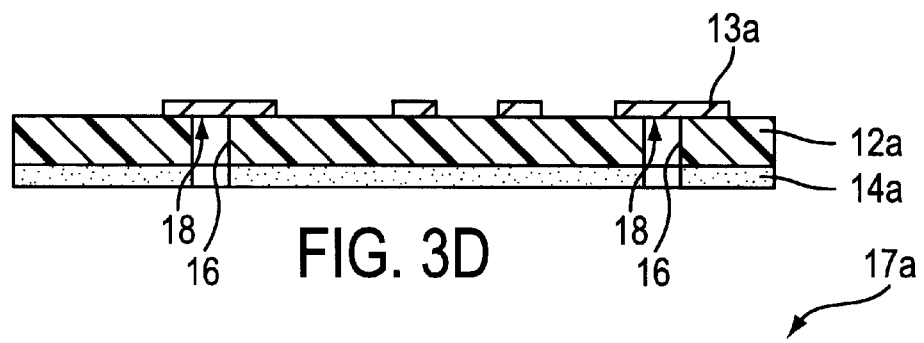

④ Next, holes 16 are formed so as to pass the adhesive layer 14a and the insulating hard substrate 12a in a thickness direction and contact with a conductor as shown in FIG. 3(d). It is preferable to form the holes 16 by irradiating a laser to the insulating hard substrate 12a from a side of the adhesive layer 14a. As the drilling machine irradiating a laser can be used, for example, a pulseoscillation type carbon dioxide gas laser drilling machine. Thus, holes having a microsize of 60~200 μmφ can be formed in a high accuracy by using the carbon dioxide gas laser drilling machine. As a result, it is possible to form viaholes in a high density and a multilayer printed wiring board having a small size and a high density can be manufactured.

According to the drilling method irradiating the laser, holes can be drilled in only the adhesive layer 14a and portions of the insulating hard substrate 12a without damaging the conductor circuit 13a, so that the resulting holes 16 are opened only at the side of the adhesive layer 14a and closed with the conductor circuit at the other end. Thus, the electrical connection between the viahole and the conductor circuit 13a can surely be attained. Moreover, desmear treatment may be applied in order to clean the surface 18 of the conductor circuit at the bottom of the hole 16.

Figure 3E:
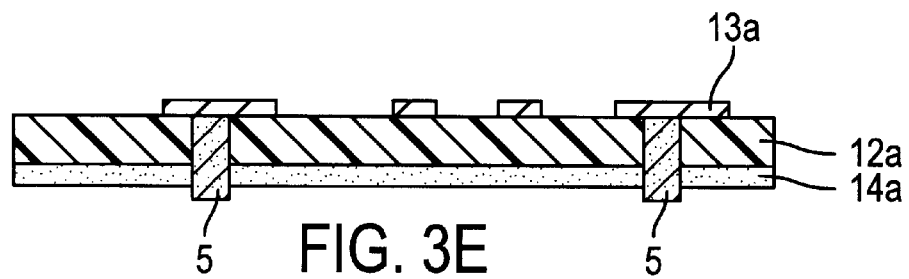

⑤ Then, as shown in FIG. 3(e), a conductive paste 5 is filled in the hole 16 to prepare a single-sided circuit substrate 17a. As the method of filling the conductive paste 5, there can be adopted a screen printing method using, for example, a metal mask. In order to form the viahole in a high accuracy in the filling, it is advantageous to previously form a protection mask around the hole 16. The protection mask may be formed by laminating a film or a paper on the surface of the adhesive layer 14a and drilling together in the formation of the hole. And also, it is advantageous that the conductive paste is filled to an extend somewhat exceeding over the hole 16 in order to realize the viahole having a good electrical connection to the conductor circuit as an innerlayer of another circuit substrate to be laminated. Moreover, it is advantageous to precure the filled conductive paste for enhancing the working efficiency of subsequent steps, and the protection mask is peeled off before the lamination.

Figure 4:
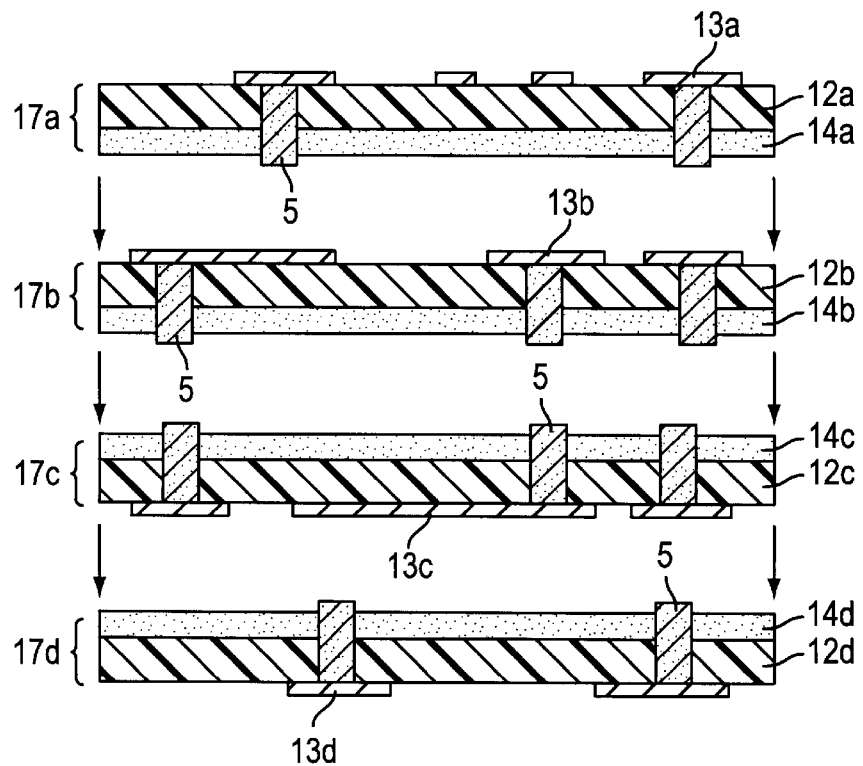
FIG. 4 is a diagrammatically section view illustrating an embodiment of steps combining the single-sided circuit substrates in the manufacture of the above multilayer printed wiring board.

(2) Single-sided circuit substrates 17b, 17c, 17d as shown in FIG. 4 comprising insulating hard substrates 12b, 12c, 12d and conductor circuits 13b, 13c, 13d formed on a surface of the substrate, adhesive layers 14b, 14c, 14d formed on the other surface and viaholes forming holes 16 passing the insulating hard substrate and the adhesive layers and contacting with the conductor and filling the conductive paste 5 therein are prepared at the same steps as mentioned above.

(3) Then, the above single-sided circuit substrates 17a, 17b, 17c, 17d are piled one upon the other in given order while positioning with guide holes and guide pins arranged on the peripheral portions of the single-sided circuit boards. In this case, the conductor circuit 13c of the single-sided circuit substrate 17c is piled on the adhesive layer 14d of the single-sided circuit substrate 17d, and the adhesive layer 14b of the single-sided circuit substrate 17b is piled on the adhesive layer 14c, and the adhesive layer 14a of the single-sided circuit substrate 17a is piled on the conductor circuit 13b.

(4) After the single-sided circuit substrates are piled in this way, they are heated and pressed within a temperature range of 140° C.~200° C. with a hot press, whereby these single-sided circuit substrates are pressed and integrally united in form of a multilayer at once.

In this step, the single-sided circuit substrates 17a, 17b, 17c, 17d piled one upon the other through the adhesive layers 14a, 14b, 14c, 14d are integrally united in form of the multilayer by thermosetting the adhesive layers 14a, 14b, 14c, 14d at a closed state. At the same time, the conductive paste is thermoset at a state of closing to the respective conductor circuit to form the viaholes, whereby the multilayer printed wiring board 1 is obtained.

ANOTHER EXAMPLE (1) Although the multilayer printed wiring board comprised of four single-sided circuit substrates is described in the above example, the invention can be similarly applied to a case of three layer or higher multilayer of 5 or more layers, or can manufacture multilayer printed wiring board by laminating the single-sided circuit substrate according to the invention onto a single-sided printed substrate, both-sided printed substrate, both-sided through-hole printed substrate or multilayer printed substrate produced by the conventional method.

(2) Although the drilling for making the holes for the formation of the viahole is carried out by irradiating laser in the above example, a mechanical means such as drilling, punching or the like may be applied. The method of manufacturing the single-sided circuit substrate and the multilayer printed wiring board of the latter case will be described with reference to FIGS. 5 and 6.

Figure 5A:
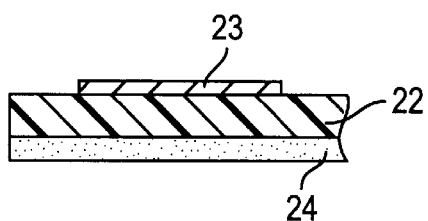
FIG. 5 is a diagrammatically partial section view illustrating manufacture steps of another single-sided circuit substrate used for the manufacture of the multilayer printed wiring board.

① At first, as shown in FIG. 5(a), a conductor circuit 23 is formed on an insulating hard substrate 22 by etching a metal foil adhered onto a surface of the substrate, and an adhesive layer 24 is formed on a surface of the substrate opposite to the conductor circuit 23.

Figure 5B:
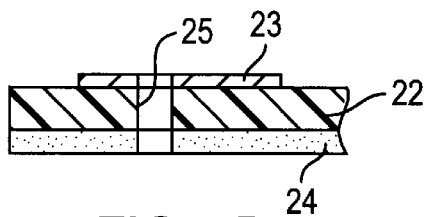
Figure 5C:
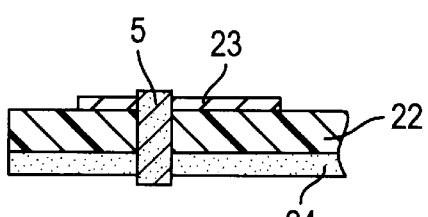

② Next, a through-hole 25 is formed by means of a mechanical means such as drilling, punching or the like as shown in FIG. 5(b) and a conductive paste 5 is filled in the through-hole 25 to prepare a single-sided circuit substrate. In this case, it is advantageous that the conductive paste 5 is filled to an extent somewhat exceeding over the through-hole 25 for providing the viahole having a good connection to a conductor circuit of another circuit substrate to be connected as shown in FIG. 5(c).

Figure 6:
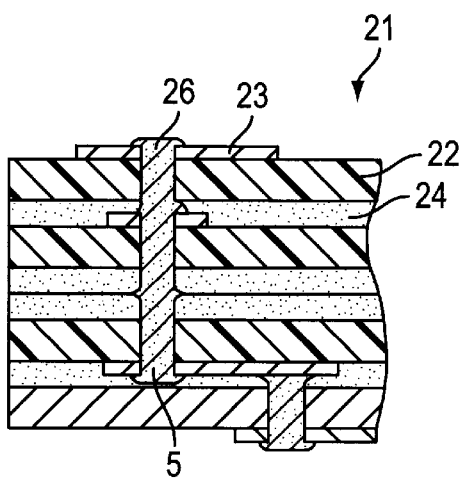
FIG. 6 is a diagrammatically partial section view of another embodiment of the multilayer printed wiring board according to the invention.

③ Then, a multilayer printed wiring board 21 having viaholes 26 as shown in FIG. 6 is obtained by piling a plurality of the single-sided circuit substrates one upon the other and integrally uniting them in the same manner as described above.

(3) In the multilayer printed wiring board according to the invention, the surface wiring pattern may be formed only in form of pads for mounting a chip electronic component.

As mentioned above, the single-sided circuit substrate for the multilayer printed wiring board according to the invention can efficiently manufacture a high-density multilayer printed wiring board having an IVH structure in a high yield by using such single-sided circuit boards and integrally uniting them in a multilayer form through pressing at once because it is subjected to a given treatment and has an adhesive layer.

And also, according to the method of manufacturing the multilayer printed wiring board according to the invention using the above single-sided circuit substrate, only the single-sided circuit substrates having no defect are joined through the adhesive layer formed on the substrate, so that the high-density multilayer printed wiring board having the IVH structure can efficiently be manufactured in a high yield without adopting the complicated method having many repeating steps as in the conventional technique.

Furthermore, the multilayer printed wiring board according to the invention constituted with the single-sided circuit boards has a structure that the single-sided circuit substrates are joined through the adhesive layer, so that it can easily be provided as the high-density multilayer printed wiring board having the IVH structure without adopting the complicated method having many repeating steps as in the conventional technique.

What is claimed is:

1. A single-sided circuit board for a multilayer printed wiring board comprising:

a single-sided copper clad laminate having an insulating hard substrate and a copper foil adhered on a surface of the substrate, a conductor circuit pattern formed on the surface of the substrate by etching the copper foil of the copper clad laminate, a resin adhesive layer formed on the other surface of the substrate, and conductive paste filled in holes formed through the substrate and adhesive layer so as to be in contact with the conductor circuit pattern to provide viaholes.

2. The slngle-sided circuit board according to claim 1 wherein said insulating hard substrate comprises at least one member selected from glass cloth epoxy resin, glass nonwoven cloth epoxy resin, glass cloth bismaleimide triazine resin, and aramide nonwoven cloth epoxy resin.

3. The single-sided circuit board according to claim 2 wherein said insulting hard substrate comprises at least one of glass cloth epoxy resin, glass nonwoven cloth epoxy resin, glass cloth bismaleimide triazine resin, and aramide nonwoven cloth epoxy resin in the form of a plate.

4. The single-sided circuit board according to claim 1 wherein said insulating hard substrate comprises glass cloth epoxy resin.

5. The single-sided circuit board according to claim 1 wherein said insulating hard substrate comprises glass nonwoven cloth epoxy resin.

6. The single-sided circuit board according to claim 1 wherein said insulating hard substrate comprises glass cloth bismaleimide triazine resin.

7. The single-sided circuit board according to claim 1 wherein said insulating hard substrate comprises aramide nonwoven cloth epoxy resin.

8. The single-sided circuit board according to claim 1 wherein said resin adhesive layer is made from at least one of epoxy resin, polyimide, bismaleimide triazine, acrylic resin, and phenolic resin.

9. The single-sided circuit board according to claim 1 wherein said conductive pastes are made of at least one of copper, silver, gold, and carbon.

10. The single-sided circuit board according to claim 1 wherein said resin adhesive layer has a thickness of 10 to 50 micron.

11. A multilayer printed wiring board having a plurality of wiling substrates which are laminated and electrically connected to each other through interstitial viaholes, comprising:

at least one of the wiring substrates being formed by a single-sided circuit board, wherein said single-sided circuit board having an insulating hard substrate and a copper foil adhered on the substrate, a conductor circuit pattern formed on a surface of the substrate by etching the copper foil of the copper clad laminate, a resin adhesive layer formed on the other surface of the substrate, and conductive paste filled in holes through the substrate and adhesive layer to be in contact with the conductor circuit pattern to provide viaholes.

12. A method of manufacturing a multilayer printed wiring board comprising:

forming a conductor circuit pattern on a surface of a single-sided copper clad laminate having an insulating hard substrate and a copper foil adhered on the substrate by etching the copper foil;

forming a resin adhesive layer on an opposite surface of the substrate;

forming holes penetrating through the hard substrate and resin adhesive layer so as to be in contact with the conductor circuit patterns;

filling conductive paste in the holes to provide a single-sided circuit board with viaholes;

piling two or more of the single-sided circuit boards one upon the other or piling the single-sided circuit board upon another circuit board to provide piled single-sided circuit boards; and pressing the piled single-sided circuit boards at once through the resin adhesive layer into a multilayer form.

13. The method according to claim 12 wherein the piled single-sided circuit boards are hot-pressed together.

14. The method according to claim 12 wherein the piled single-sided circuit boards are hot-pressed together to integrally unite the single-sided circuit boards.

* * * * *

UNITED STATES PATENT AND TRADEMARK OFFICE
CERTIFICATE OF CORRECTION

PATENT NO. : 6,320,140 B1
DATED : November 20, 2001
INVENTOR(S) : R. Enomoto

It is certified that error appears in the above-identified patent and that said Letters Patent is hereby corrected as shown below:

<u>Title page,</u>
Item [57], ABSTRACT,
Line 3, "writing" should be -- wiring --.

<u>Column 10,</u>
Line 53, "wiling" should be -- wiring --.
Line 26, "insulting" should be -- insulating --.

Signed and Sealed this

Twenty-fifth Day of June, 2002

Attest:

JAMES E. ROGAN
Attesting Officer          Director of the United States Patent and Trademark Office